US008415952B2

(12) United States Patent
Lvovsky

(10) Patent No.: US 8,415,952 B2
(45) Date of Patent: Apr. 9, 2013

(54) SUPERCONDUCTING MAGNET COIL INTERFACE AND METHOD PROVIDING COIL STABILITY

(75) Inventor: Yuri Lvovsky, Florence, SC (US)

(73) Assignee: General Electric Company, Schenectady, NY (US)

( * ) Notice: Subject to any disclaimer, the term of this patent is extended or adjusted under 35 U.S.C. 154(b) by 576 days.

(21) Appl. No.: 12/646,917

(22) Filed: Dec. 23, 2009

(65) Prior Publication Data

US 2011/0148417 A1   Jun. 23, 2011

(51) Int. Cl.
 *G01V 3/00*   (2006.01)

(52) U.S. Cl.
 USPC .......................................................... 324/318

(58) Field of Classification Search ........... 324/300–322
See application file for complete search history.

(56) References Cited

U.S. PATENT DOCUMENTS

| | | | |
|---|---|---|---|
| 4,912,444 A | | 3/1990 | Dederer et al. |
| 5,417,073 A | | 5/1995 | James et al. |
| 5,513,498 A | | 5/1996 | Ackermann et al. |
| 6,354,087 B1 | | 3/2002 | Nakahara et al. |
| 6,965,236 B2 * | 11/2005 | Havens | ............... 324/319 |
| 7,015,692 B2 * | 3/2006 | Clarke et al. | ............... 324/300 |
| 7,135,863 B2 | | 11/2006 | Arik et al. |
| 7,154,270 B2 * | 12/2006 | Arz et al. | ............... 324/318 |
| 7,319,329 B2 | | 1/2008 | Huang et al. |
| 7,626,477 B2 | | 12/2009 | Huang et al. |

| | | | |
|---|---|---|---|
| 2006/0207266 A1 | | 9/2006 | Belton et al. |
| 2006/0284711 A1 | | 12/2006 | Atkins et al. |
| 2007/0001521 A1 | | 1/2007 | Kruip et al. |
| 2007/0247263 A1 | | 10/2007 | Calvert et al. |
| 2008/0179784 A1 | | 7/2008 | Calvert |
| 2009/0039991 A1 | | 2/2009 | Atkins et al. |
| 2009/0128270 A1 | | 5/2009 | Calvert et al. |
| 2009/0149846 A1 | | 6/2009 | Hoey et al. |
| 2009/0174407 A1 | | 7/2009 | Han et al. |
| 2009/0184714 A1 | | 7/2009 | Tigwell et al. |
| 2012/0108433 A1 * | 5/2012 | Jiang et al. | ............... 505/163 |

FOREIGN PATENT DOCUMENTS

| | | |
|---|---|---|
| EP | 0487352 A2 | 5/1992 |
| GB | 2435918 A | 9/2007 |
| JP | 07249511 A | 9/1995 |
| JP | 09055312 A | 1/1997 |

OTHER PUBLICATIONS

Search Report from corresponding GB Application No. GB1021199.3 dated Apr. 13, 2011.

* cited by examiner

*Primary Examiner* — Dixomara Vargas
(74) *Attorney, Agent, or Firm* — The Small Patent Law Group; Dean D. Small

(57) ABSTRACT

A superconducting magnet coil interface and method providing coil stability are provided. A superconducting coil arrangement includes a superconducting coil and a thermal interface coupled to the superconducting coil. The thermal interface is configured to intercept frictional heat before reaching the superconducting coil. The superconducting coil arrangement further includes a plurality of channels extending within at least a portion of the thermal interface and towards the superconducting coil. The plurality of channels are configured to receive therein a cooling liquid.

21 Claims, 5 Drawing Sheets

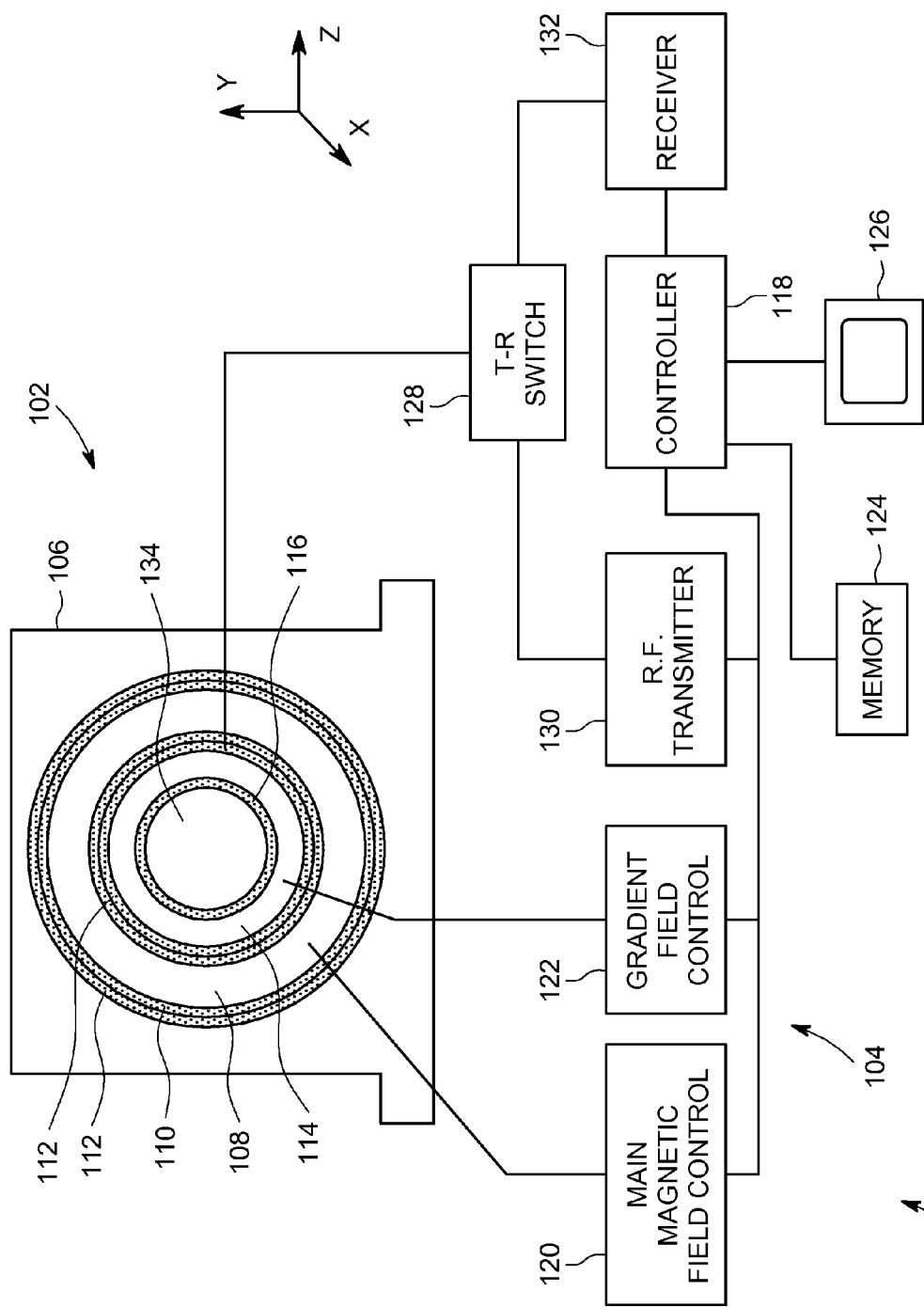

SUPERCONDUCTING MAGNET COIL INTERFACE AND METHOD PROVIDING COIL STABILITY

BACKGROUND OF THE INVENTION

The subject matter disclosed herein relates generally to superconducting magnets, and more particularly to systems and methods for providing coil stability for superconducting magnets.

Superconducting coils, for example superconducting coils forming Magnetic Resonance Imaging (MRI) magnets, experience large axial and radial electromagnetic (EM) forces during coil energization. In MRI systems, the magnet coils can be self-supporting in the radial direction. However, in the axial direction, because of the significant inter-coil forces, the magnet coils need to have support at the coil flanges through the interface with a support structure (e.g., coil former).

When the magnet coils are expanding radially, such as during energization, frictional heat is generated and released due to stick-slip motion between the coil support and the magnet coils. The generated heat can overheat a localized area of the coil and create a normal zone, where the conductor loses superconducting property and transfers to a normal resistive state. The normal zone will spread through the coil due to the Joule heat and the thermal conduction, which results in a quench event. The quench is accompanied by the rapid boil-off of helium escaping from the cryogen bath in which the magnet coils are immersed. Each quench, followed by the re-fill and re-ramp of the magnet, is an expensive and time consuming event.

In some conventional MRI systems, a slip plane is provided with low friction in an attempt to reduce frictional heat generation. However, stability at the slip plane interface is still a major limiting risk and cost fact in high field magnets. Other MRI systems include mechanisms to immobilize the coils. The immobilization of the coils is difficult, particularly for coils with larger forces.

BRIEF DESCRIPTION OF THE INVENTION

In accordance with various embodiments, a superconducting coil arrangement is provided that includes a superconducting coil and a thermal interface coupled to the superconducting coil. The thermal interface is configured to intercept frictional heat before reaching the superconducting coil. The superconducting coil arrangement further includes a plurality of channels extending within at least a portion of the thermal interface and towards the superconducting coil. The plurality of channels are configured to receive therein a cooling liquid.

In accordance with other embodiments, a magnetic resonance imaging (MRI) system is provided that includes a gantry, a coil support within the gantry and a superconducting coil magnet supported by the coil support. The MRI system further includes a thermal interface between the coil support and the superconducting coil magnet configured to intercept axially a frictional heat generated between the thermal interface and the coil support.

In accordance with yet other embodiments, a method for providing a superconducting magnet is provided. The method includes providing a thermal interface in combination with a coil of a superconducting magnet and configuring the thermal interface to include a plurality of axial channels therein for receiving a cooling liquid to intercept a frictional heat generated between the thermal interface and a support for the superconducting magnet.

In accordance with still other embodiments, a superconducting magnet is provided that includes a plurality of coils and a support for supporting the plurality of coils. The superconducting magnet further includes a thermal interface between the plurality of coils and the support. The thermal interface includes a plurality of axial channels therein for receiving a cooling liquid to intercept a frictional heat generated between the thermal interface and the support.

BRIEF DESCRIPTION OF THE DRAWINGS

FIG. 8 is a pictorial view of a Magnetic Resonance Imaging (MRI) system in which a superconducting coil magnet having a thermal interface formed in accordance with various embodiments may be implemented.

DETAILED DESCRIPTION OF THE INVENTION

Figure 1:
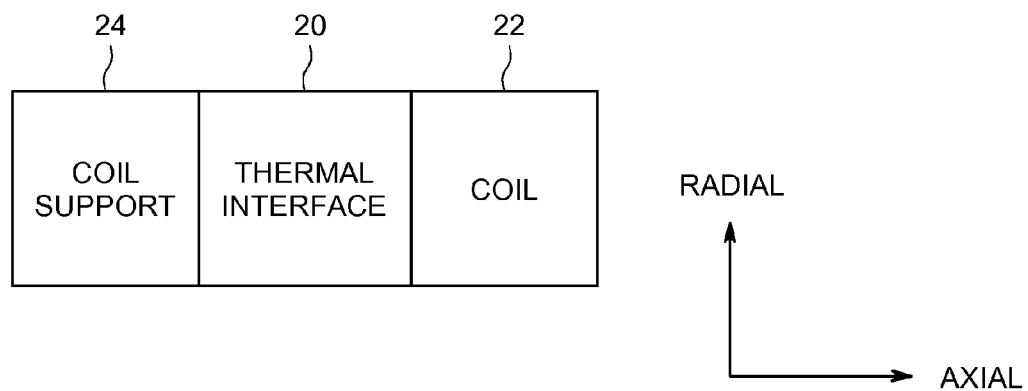
FIG. 1 is a simplified block diagram of thermal interface for a superconducting coil magnet formed in accordance with various embodiments.

The foregoing summary, as well as the following detailed description of certain embodiments, will be better understood when read in conjunction with the appended drawings. To the extent that the figures illustrate diagrams of the functional blocks of various embodiments, the functional blocks are not necessarily indicative of the division between hardware. Thus, for example, one or more of the functional blocks may be implemented in a single piece of hardware or multiple pieces of hardware. It should be understood that the various embodiments are not limited to the arrangements and instrumentality shown in the drawings.

As used herein, an element or step recited in the singular and proceeded with the word "a" or "an" should be understood as not excluding plural of said elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

Various embodiments provide systems and methods for cooling superconducting magnets, particularly heat generated by the coils of superconducting magnets, such as during energization thereof. The various embodiments include a thermal interface that provides active cooling and/or absorption of heat generated by frictional forces. In superconducting magnets for a Magnetic Resonance Imaging (MRI) system having helium-cooled coils, the thermal interface intercepts frictional heat generated, for example, by the coils during energization. The removal or reduction of heat at a stick-slip plane between the coils and a coil support is realized by the practice of some embodiments of the described systems and techniques.

It should be noted that although some embodiments may be described in connection with superconducting magnets for MRI systems, the various embodiments may be implemented in connection with any type of system having superconducting magnets. The superconducting magnets may be implemented in other types of medical imaging devices, as well as non-medical imaging devices.

As shown in FIG. 1, a thermal interface 20 formed in accordance with various embodiments is provided between one or more coils 22 (referred to herein as the coil 22), for example, of an MRI system, and a coil support 24, which may be a former or other supporting structure. In some embodiments, the coil 22 may be formed from an epoxied coil structure, such as a plurality of coil elements wound in a predetermined arrangement and filled with an epoxy resin used to secure the coil elements together. The coil 22 may be a radially self-supporting coil in some embodiments. In operation in an MRI system, the plurality of coil elements generate homogeneous magnetic fields when electric current flows through the coils. The coils are formed of conductive line members wound in a winding pattern corresponding to a magnetic field pattern to be generated. An epoxy resin material may be filled into gaps between conductive line members to maintain the winding arrangement of the line members in the predetermined winding pattern.

It should be noted that FIG. 1 illustrates a portion of an MRI magnet that may be used for magnetic resonance (MR) imaging. The illustrated embodiment in FIG. 1 forms part of larger imaging components of the MRI system as described in more detail herein.

Figure 2:
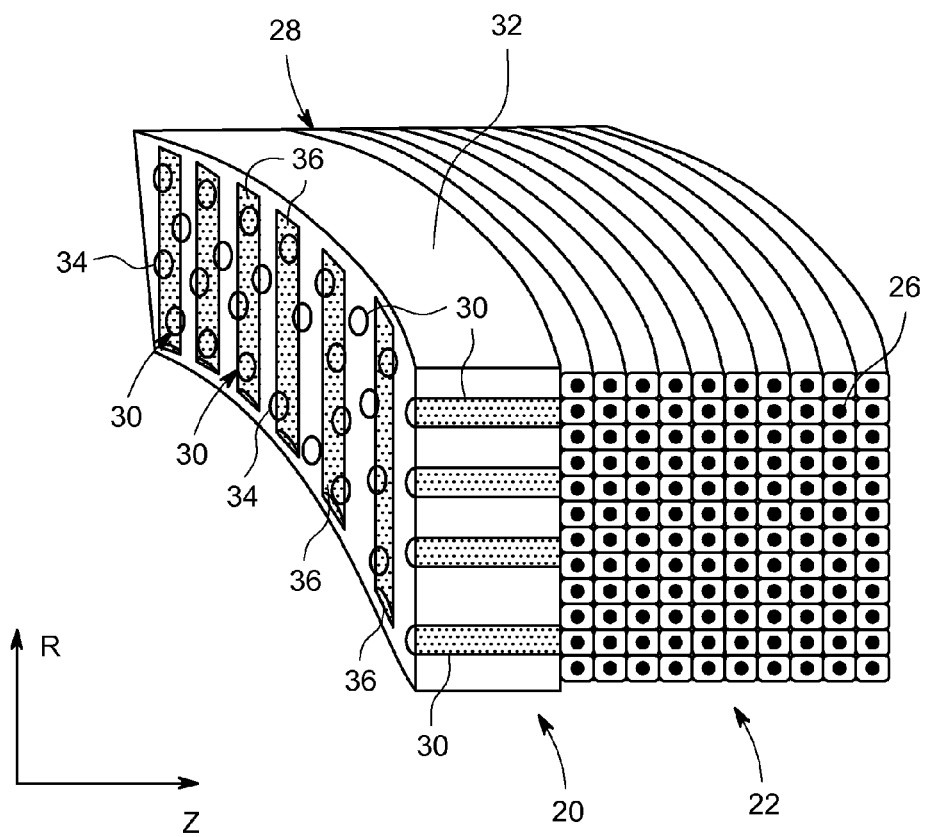
FIG. 2 is a cross-sectional view of a portion of superconducting coil magnet having a thermal interface formed in accordance with various embodiments.

As shown in FIG. 2, the coil 22 is formed from a plurality of conductive line members 26 forming a winding arrangement secured together with an epoxy resin. Thus, an epoxied coil structure defines the coil 22. It should be noted that the coil 22 may be formed in any suitable manner, for example, as known in the art, which may or may not include a separate and/or integrated coil support structure.

The thermal interface 20 is one of coupled to the coil 22 or formed as part of the coil 22. For example, in some embodiments, the thermal interface 20 is epoxied to the coil 22. In other embodiments, the thermal interface 20 may be molded with the coil 22. The thermal interface 20 is generally a perforated thermal intercept, which may be configured in a ring shape, for example, to secure to a side or surface of a coil ring or may be configured as multiple brackets that are secured along different radial positions along a side or surface of the coil ring. Thus, the thermal interface 20 may be formed as a single ring or a plurality of discrete brackets that are circumferentially spaced along the coil 22. It should be noted that only a portion of the coil 22 forming the coil ring is shown in FIG. 2.

The thermal interface 20 may be formed from any suitable material, for example, a solid composite material. For example, the thermal interface 20 may be formed from Phenolic or G-10 sheeting. In other embodiments, and for example, the thermal interface 20 may be formed from a filled epoxy material, such as an epoxy resin filled with a strengthening material (filler) or a heat absorbing material like ceramic, among others. In various embodiments, the thermal interface 20 may be formed from the same epoxy resin used in the coil 22 such that the thermal interface 20 may be molded with the coil 22 as a single unitary structure. In other embodiments, the thermal interface 20 may be molded or formed separately and thereafter secured to the coil 22. The thermal interface 20 may be secured to a radial surface of the coil 22, for example, an inner surface 28, which may include a loading flange (not shown). The securing of the thermal interface 20 to the coil 22 may be provided in any manner and using any securing means (e.g., epoxy).

The thermal interface 20 is formed as a perforated thermal intercept to intercept the heat, such as frictional heat generated by axial movement of the coil 22 during energization. It should be noted that the thermal interface 20, as described in more detail herein, performs active cooling to intercept heat. In particular, the thermal interface 20 intercepts or absorbs heat before the heat reaches the coil 22. Accordingly, the amount of heat that reaches the coil 22 is reduced or eliminated. It also should be noted that as used herein, heat can refer to any type of heat or thermal energy.

Referring specifically to FIG. 2, the thermal interface 20 includes a plurality of channels 30 within a body 32 of the thermal interface 20. The channels 30 in various embodiments are axially aligned to form passages through at least a portion of the body 32 in the axial direction. The channels 30 are generally spaced apart longitudinally and transversally across the body 32. For example, when the thermal interface 20 is in a ring or arc configuration, the channels 30 may be spaced apart both circumferentially about a center axis and radially. The number and arrangement of the channels 30 may be changed as desired or needed. For example, a different number of channels 30 may be provided longitudinally and/or transversally along the body 32. Additionally, the channels 30 may be evenly spaced, such that each channel 30 is spaced the same distance between adjacent channels 30 or the spacing may be varied. In some embodiments, the distance between the channels 30 in one or more directions is less than the thickness of the body 32.

The channels 30 have one or more open ends, for example, each channel 30 may have an opening 34 on a side of the body 32 opposite the coil 22. In some embodiments, the other end of the channels 30 may or may not be open. Accordingly, in some embodiments, the plurality of channels 30 extend substantially through the body 32 and in other embodiments the plurality of channels 30 extend entirely through the body 32. Additionally, in some embodiments, the opening 34 may not be provided such that the channels 30 are closed on each end. The channels 30 are configured to receive therein a liquid, such as a cooling liquid or any type of liquid capable of at least one of intercepting, absorbing, transferring and/or dissipating heat. In an MRI application, the cooling liquid may be liquid helium that enters the channels 30 through the openings 34. In some embodiments, liquid helium will enter the channels 30 through the body 32.

In embodiments wherein the thermal interface 20 is a molded structure, rods, such as polytetrafluoroethylene (PTFE) rods (or rods formed from other materials with low adhesive properties) may be inserted within the mold during the molding and curing process. Thereafter, the rods are removed to form passages that defines the channels 30. This molding process may be provided as part of the process of forming the coil 22 or separate therefrom and later coupled or secured thereto (e.g., epoxied to the coil 22).

The thermal interface 20 optionally includes a plurality of grooves 36 along at least one surface of the body 32. For example, as illustrated in FIG. 2, the grooves 36 extend generally perpendicular to the channels 30 at a surface of the body 32 having the openings 34 (e.g., extend radially). The grooves 36 in some embodiments are provided by scoring the surface of the body 32. The grooves 36 may interconnect at least two of the openings 34 and may also connect one or more of the openings 34 to a source of cooling liquid, for example, a helium vessel in which in the coil 22 is placed. Accordingly, the grooves 36 provide a passageway for the cooling liquid to enter the channels 30. Additionally, the grooves 36 also provide a passageway for the cooling liquid to exit the channels 30, for example, when helium heated during quench expands and escapes.

Figure 3:
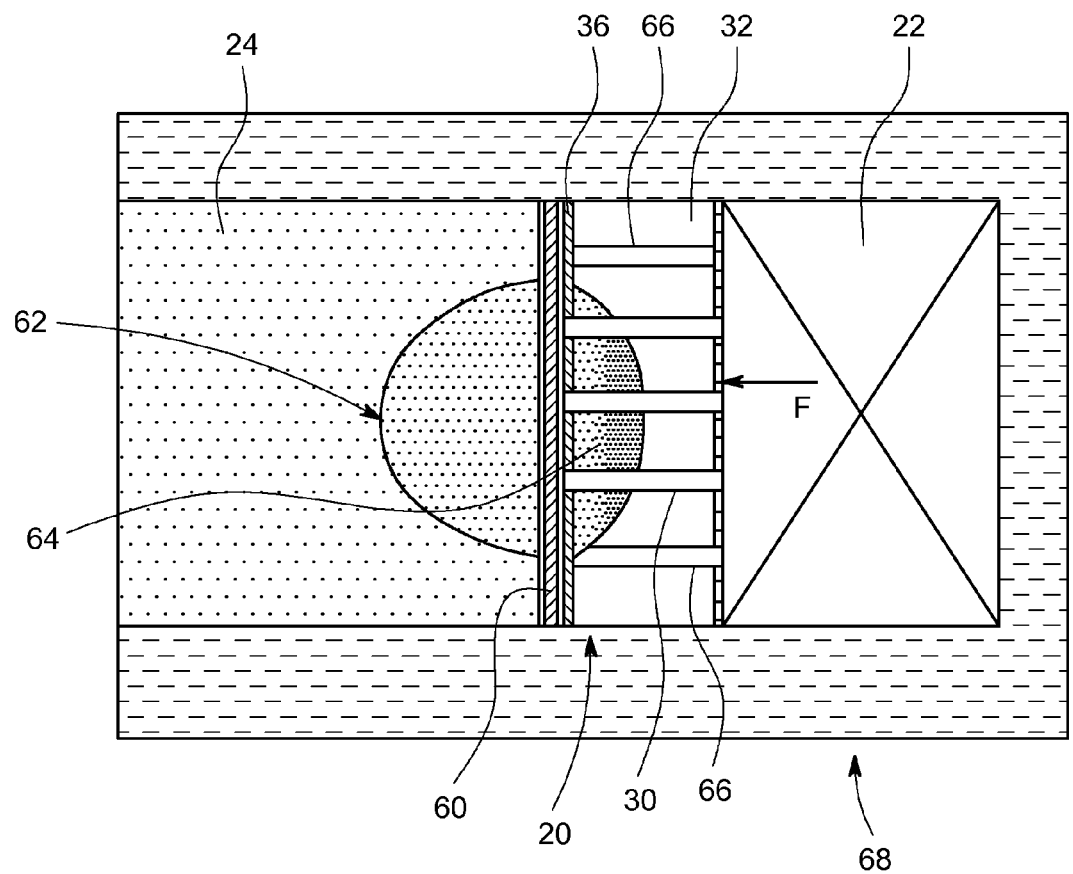
FIG. 3 is a diagram illustrating heat dissipation with a thermal interface formed in accordance with various embodiments.

As shown in FIG. 3, a slip plane 60 is between the thermal interface 20 and the coil support 24 that is subject to a stick-slip motion. For example, in an MRI system, the slip plane 60 is subject to an axial stick-slip motion as a result of an axial force (illustrated by the F arrow in FIG. 3), which may be generated as a result of energization of the coil 22. The stick-slip motion creates or generates frictional heat 62. When the heat 62 is generated, the heat travels from the coil support 24 (which is generally heat insulating to protect an object being imaged in the bore 56 (shown in FIG. 3)), such that heat 62 moves or is transferred towards the coil 22 through the thermal interface 20. A temperature distribution 64 results in the thermal interface 20 such that the heat is at least one of intercepted, absorbed, dissipated and/or reduced prior to reaching the coil 22. In particular, the heat is absorbed and transferred away from the coil 22 by the cooling liquid 66 (e.g. liquid helium) within the channels 30 and optionally within the grooves 36. For example, the cooling liquid 66 intercepts the released heat from the slip plane 60 and intercepts (e.g., prevents or reduces) the amount of heat 62 reaching the coil 22. Some of the heat 62 is released through the grooves 36 (e.g., evaporated through the grooves 36), which act as a helium quench escape for release of heated cooling liquid 66.

It should be noted that the source of the cooling liquid 66 may be from a cooling bath 68, for example, a helium bath within a vessel in which the coil 22, thermal interface 20 and coil support 24 are placed. The vessel may be, for example, a helium vessel in an MRI system as described in more detail below.

Thus, various embodiments may provide a coil interface for helium-cooled coils with increased coil stability. The thermal interface thermally intercepts the frictional heat generated at the slip plane that causes frictional stick-slip heat. The thermal interface, which may be formed as a perforated spacer (having a plurality of channels), operates as a thermal intercept and is securely attached to the coil or coil flange. The channels are filled with a cooling fluid, such as liquid helium with the slip plane provided on the opposite side of the thermal interface where the stick-slip motion will occur. The thermal interface may be formed from one or more different materials, such as a resin, filled or unfilled, a PTFE material or a biaxially-oriented polyethylene terephthalate (boPET) material. The thermal disturbance generated at the slip plane, while propagating through the thermal interface, is cooled and/or absorbed or intercepted by a cooling liquid in the channels and does not reach the coil or has a substantially reduced temperature when reaching the coil. When a thermal disturbance is generated at the outer side of the thermal interface, the thermal interface serves as a spacer and thermal barrier, absorbing the heat with the heat absorbing capacity thereof. Additionally, the temperature wave is cooled or intercepted by, for example, helium in the channels, which is evaporated and replenished. As a result, significant temperature elevation reaching the coil is reduced, such that that the possibility of quench is reduced or eliminated.

It should be noted that the channels in the thermal interface also results in a lower average modulus for the thermal interface in the radial direction, and therefore a better compliance with a radially expanding coil and accordingly reducing the probability of a crack at the coil/thermal interface plane.

Figure 4:
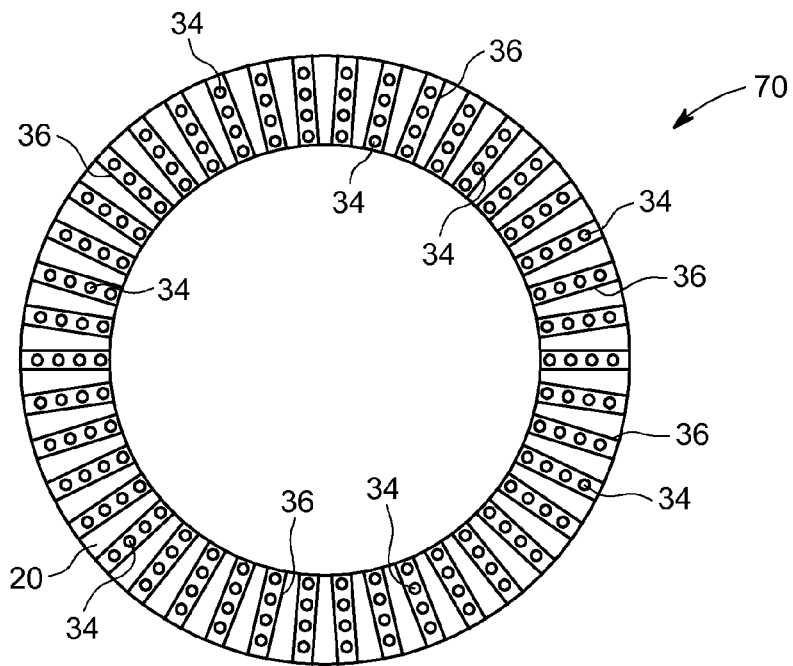
FIG. 4 is a diagram illustrating a complete ring configuration of a thermal interface formed in accordance with various embodiments.
Figure 5:
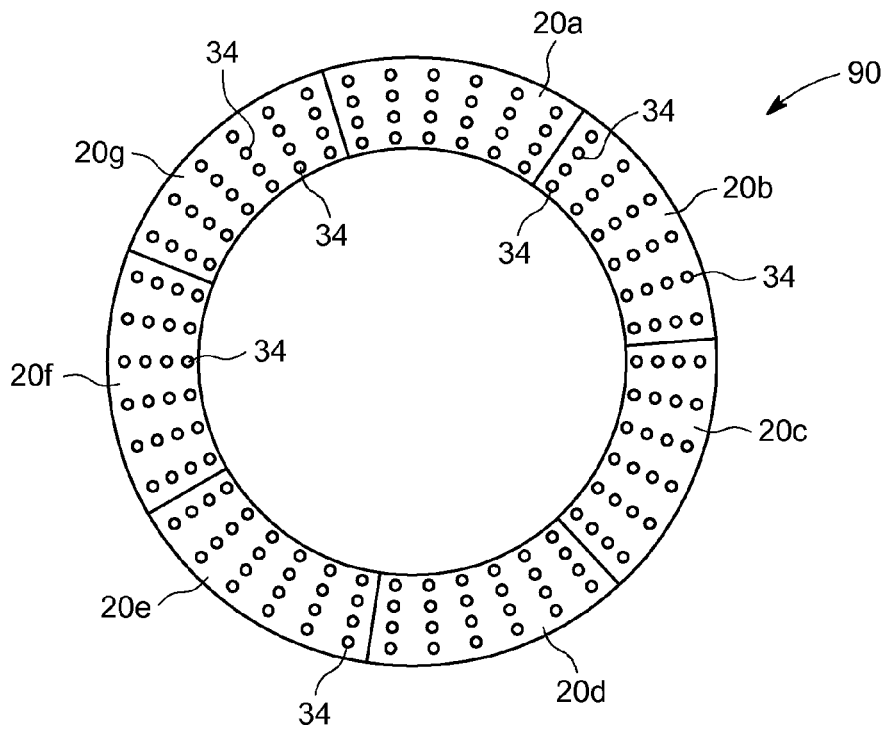
FIG. 5 is a diagram illustrating a multi-bracket configuration of a thermal interface formed in accordance with various embodiments.
Figure 6:
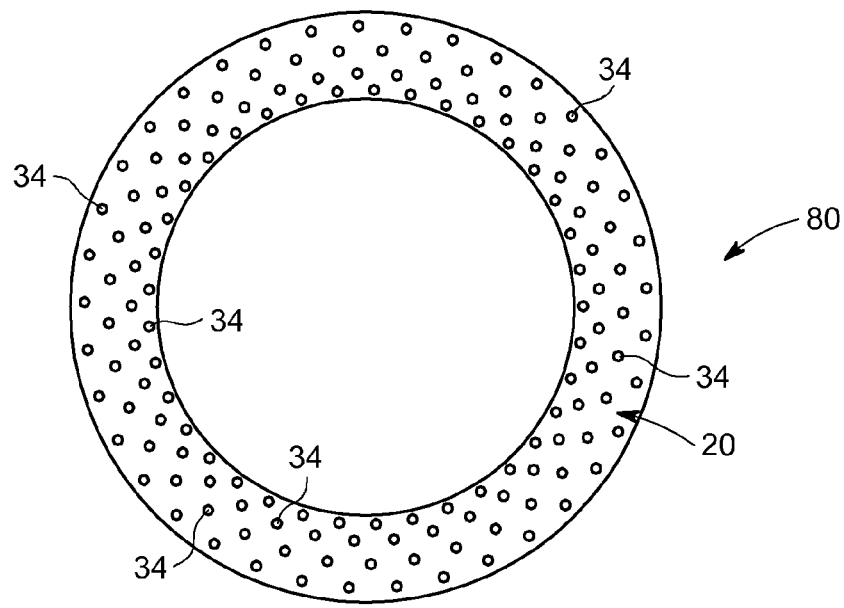
FIG. 6 is a diagram illustrating another complete ring configuration of a thermal interface formed in accordance with various embodiments.
Figure 7:
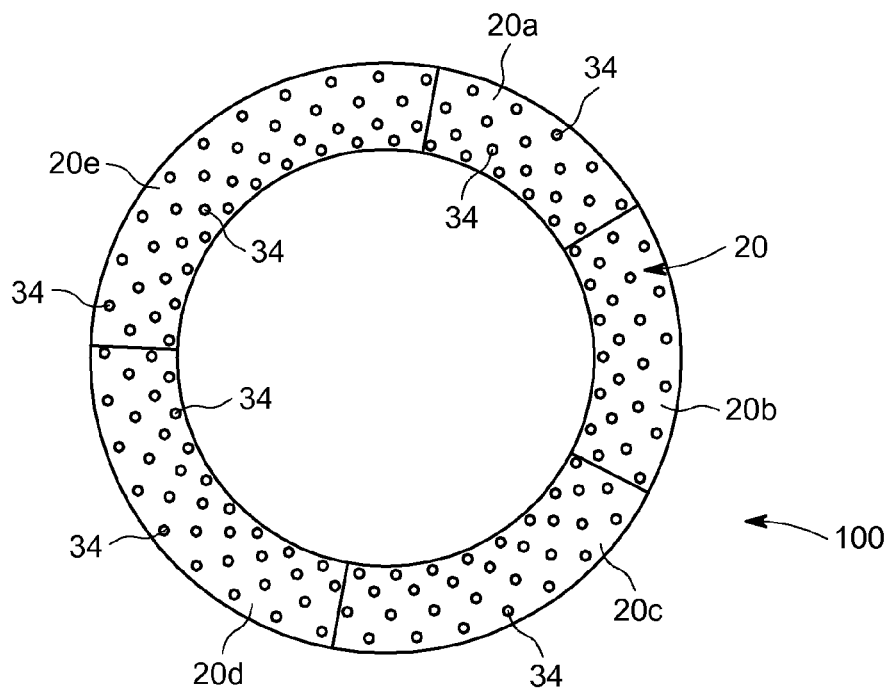
FIG. 7 is a diagram illustrating another multi-bracket configuration of a thermal interface formed in accordance with various embodiments.

In accordance with various embodiments, a complete ring configuration 70 or 80 as shown in FIGS. 4 and 6, respectively, may be provided. In accordance with other embodiments, a multi-bracket configuration 90 or 92 as shown in FIGS. 5 and 7 may be provided. It should be noted that FIGS. 4-7 illustrate axial cross-sectional axial views showing a surface of the thermal interface 20 opposite the coil 22. It also should be noted that the number and spacing of the channels 30 (shown in FIGS. 2 and 3) and the corresponding openings 34 are shown for illustrative purposes only. The number and spacing of the channels 30 and corresponding openings 34 may be changed as desired or needed, for example, to have more or less channels 30 and corresponding openings 34 that are evenly or non-evenly spaced (e.g., staggered spacing). Additionally, the number of channels 30 and corresponding openings 34 may be different such that a symmetric or random pattern of channels 30 and corresponding openings 34 are provided.

In particular, as shown in FIGS. 4 and 6, the thermal interface 20 may be formed as a single ring adjacent the coil 22 (shown in FIGS. 1-3). It should be noted that the thermal interface 20 in the complete ring configurations 70 and 80 may be formed as part of the coil 22 or separately therefrom and secured thereto. The complete ring configuration 70 also illustrates the optional grooves 36. In other embodiments, for example, as shown in FIGS. 5 and 7, a plurality of thermal interfaces 20*a*-20*g* and 20*a*-20*e*, respectively are provided as a set of discrete circumferentially spaced brackets that are secured to the coil 22 at different positions to thereby form a complete ring. The brackets may be sized such that more or less channels 30 and corresponding openings 34 may be provided on each bracket. Additionally, the number of channels 30 and corresponding openings 34 on each bracket may be the same or different.

The various embodiments may be implemented in connection with different types of superconducting coils, such as superconducting coils for an MRI system. For example, the various embodiments may be implemented with superconducting coils for use with the MRI system 100 shown in FIG. 8. It should be appreciated that although the system 100 is illustrated as a single modality imaging system, the various embodiments may be implemented in or with multi-modality imaging systems. The system 100 is illustrated as an MRI imaging system and may be combined with different types of medical imaging systems, such as a Computed Tomography (CT), Positron Emission Tomography (PET), a Single Photon Emission Computed Tomography (SPECT), as well as an ultrasound system, or any other system capable of generating images, particularly of a human. Moreover, the various embodiments are not limited to medical imaging systems for imaging human subjects, but may include veterinary or non-medical systems for imaging non-human objects, luggage, etc.

Referring to FIG. 8, the MRI system 100 generally includes an imaging portion 102 and a processing portion 104 that may include a processor or other computing or controller device. The MRI system 100 includes within a gantry 106 a superconducting magnet 108 formed from coils, for example, coils 22 (shown in FIGS. 1-3) supported on a magnet coil support structure, for example the coil support 24 (shown in FIGS. 1-3). A vessel 110 (also referred to as a cryostat) surrounds the superconducting magnet 108 and is filled with liquid helium. The liquid helium may be used to intercept heat to reduce or eliminate the amount of heat that reaches the coils of the superconducting magnet 108, which includes providing the liquid helium to the channels 30 of the thermal interface 20 (both shown in FIGS. 2 and 3) as described in more detail herein. Thermal insulation 112 is provided surrounding the outer surface of the helium vessel 110 and the inner surface of the superconducting magnet 108. A plurality of magnetic gradient coils 114 are provided inside the superconducting magnet 108 and an RF transmit coil 116 is provided within the plurality of magnetic gradient coils 114. In some embodiments, the RF transmit coil 116 may be replaced with a transmit and receive coil. The components within the gantry 106 generally form the imaging portion 102. It should be noted that although the superconducting magnet 108 is a cylindrical shape, other shapes of magnets can be used.

The processing portion 104 generally includes a controller 118, a main magnetic field control 120, a gradient field control 122, a memory 124, a display device 126, a transmit-receive (T-R) switch 128, an RF transmitter 130 and a receiver 132.

In operation, a body of an object, such as a patient or a phantom to be imaged, is placed in the bore 134 on a suitable support, for example, a patient table. The superconducting magnet 108 produces a uniform and static main magnetic field $B_o$ across the bore 134. The strength of the electromagnetic field in the bore 134 and correspondingly in the patient, is controlled by the controller 118 via the main magnetic field control 120, which also controls a supply of energizing current to the superconducting magnet 108. The thermal interface 20 (shown in FIGS. 1-7) operates, for example, to intercept or absorb heat, such as heat generated by axial frictional movement of the superconducting magnet 108 when the superconducting magnet 108 is energized, as described in more detail above.

The magnetic gradient coils 114, which include one or more gradient coil elements, are provided so that a magnetic gradient can be imposed on the magnetic field $B_o$ in the bore 134 within the superconducting magnet 108 in any one or more of three orthogonal directions x, y, and z. The magnetic gradient coils 114 are energized by the gradient field control 122 and are also controlled by the controller 118.

The RF transmit coil 116, which may include a plurality of coils, is arranged to transmit magnetic pulses and/or optionally simultaneously detect MR signals from the patient if receive coil elements are also provided, such as a surface coil configured as an RF receive coil. The RF receive coil may be of any type or configuration, for example, a separate receive surface coil. The receive surface coil may be an array of RF coils provided within the RF transmit coil 116.

The RF transmit coil 116 and the receive surface coil are selectably interconnected to one of the RF transmitter 130 or receiver 132, respectively, by the T-R switch 128. The RF transmitter 130 and T-R switch 128 are controlled by the controller 118 such that RF field pulses or signals are generated by the RF transmitter 130 and selectively applied to the patient for excitation of magnetic resonance in the patient. While the RF excitation pulses are being applied to the patient, the T-R switch 128 is also actuated to disconnect the receive surface coil from the receiver 132.

Following application of the RF pulses, the T-R switch 128 is again actuated to disconnect the RF transmit coil 116 from the RF transmitter 130 and to connect the receive surface coil to the receiver 132. The receive surface coil operates to detect or sense the MR signals resulting from the excited nuclei in the patient and communicates the MR signals to the receiver 132. These detected MR signals are in turn communicated to the controller 118. The controller 118 includes a processor (e.g., image reconstruction processor), for example, that controls the processing of the MR signals to produce signals representative of an image of the patient.

The processed signals representative of the image are also transmitted to the display device 126 to provide a visual display of the image. Specifically, the MR signals fill or form a k-space that is Fourier transformed to obtain a viewable image. The processed signals representative of the image are then transmitted to the display device 126.

In various embodiments, the RF transmitter 130 is configured to generate signals at one or more resonate frequencies, for example, centered about the Larmor frequencies of proton (hydrogen nuclei) and/or carbon (e.g., $^{13}C$ nuclei). However, it should be noted that the RF transmitter 130 may be configured to generate other frequencies causing different nuclei to resonate at their Larmor frequencies. Moreover, the MR signals and the image(s) generated may be encoded using any known technique in the art.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments without departing from their scope. While the dimensions and types of materials described herein are intended to define the parameters of the various embodiments, they are by no means limiting and are merely exemplary. Many other embodiments will be apparent to those of skill in the art upon reviewing the above description. The scope of the various embodiments should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

This written description uses examples to disclose the various embodiments, including the best mode, and also to enable any person skilled in the art to practice the various embodiments, including making and using any devices or systems and performing any incorporated methods. The patentable scope of the various embodiments is defined by the claims, and may include other examples that occur to those skilled in the art. Such other examples are intended to be within the scope of the claims if the examples have structural elements that do not differ from the literal language of the claims, or the examples include equivalent structural elements with insubstantial differences from the literal languages of the claims.

What is claimed is:
1. A superconducting coil arrangement comprising:
a superconducting coil;
a thermal interface coupled to the superconducting coil, the thermal interface including a body and configured to intercept frictional heat before reaching the superconducting coil; and
a plurality of channels formed within at least a portion of the body of the thermal interface and extending towards the superconducting coil, the plurality of channels configured to receive therein a cooling liquid.

2. A superconducting coil arrangement in accordance with claim 1 further comprising a coil support and wherein the thermal interface is between the superconducting coil and the coil support.

3. A superconducting coil arrangement in accordance with claim 1 wherein the plurality of channels extend axially from a side of the thermal interface opposite the superconducting coil towards a side of the thermal interface adjacent the superconducting coil.

4. A superconducting coil arrangement in accordance with claim 1 wherein the thermal interface includes a body and the plurality of channels extend axially through the entire body.

5. A superconducting coil arrangement in accordance with claim 1 wherein the thermal interface includes a body and the plurality of channels extend axially through a portion of the body.

6. A superconducting coil arrangement in accordance with claim 1 wherein the plurality of channels extend axially within the thermal interface.

7. A superconducting coil arrangement in accordance with claim 1 wherein the plurality of channels each comprise at least one opening and further comprising a plurality of grooves interconnecting the openings.

8. A superconducting coil arrangement in accordance with claim 7 wherein the plurality of channels are axially aligned and the plurality of grooves are perpendicular to the plurality of channels.

9. A superconducting coil arrangement in accordance with claim 1 wherein the thermal interface and superconducting coil form a single molded unitary structure.

10. A superconducting coil arrangement in accordance with claim 1 wherein the thermal interface comprises a single body formed in a ring.

11. A superconducting coil arrangement in accordance with claim 1 wherein the thermal interface comprises a plurality of discrete brackets.

12. A superconducting coil arrangement in accordance with claim 1 wherein the thermal interface comprises a body and wherein the plurality of channels are each spaced apart a distance that is less than a thickness of the body.

13. A superconducting coil arrangement in accordance with claim 1 wherein the thermal interface is configured to absorb heat.

14. A magnetic resonance imaging (MRI) system comprising:
a gantry;
a coil support within the gantry;
a superconducting coil magnet supported by the coil support; and
a thermal interface between the coil support and the superconducting coil magnet having a plurality of cooling channels extending axially towards the superconducting coil magnet and configured to intercept axially a frictional heat generated between the thermal interface and the coil support.

15. An MRI system in accordance with claim 14 further comprising a vessel surrounding the superconducting coil magnet and filled with liquid helium, and wherein the thermal interface comprises a plurality of channels configured to receive therein at least some of the liquid helium.

16. An MRI system in accordance with claim 14 wherein the plurality of channels are axially aligned and further comprising a plurality of grooves connecting the plurality of channels to the vessel.

17. An MRI system in accordance with claim 14 wherein the superconducting coil magnet comprises a plurality of conductive line members secured together with an epoxy resin and wherein the thermal interface comprises a filled epoxy resin.

18. An MRI system in accordance with claim 14 wherein the thermal interface comprises a body having a plurality of channels therein and the plurality of channels are each spaced apart a distance that is less than a thickness of the body.

19. An MRI system in accordance with claim 14 wherein the thermal interface comprises a perforated thermal intercept.

20. A method for providing a superconducting magnet, the method comprising:
providing a thermal interface in combination with a coil of a main superconducting magnet; and
configuring the thermal interface to include a plurality of channels therein for receiving a cooling liquid to intercept a frictional heat generated between the thermal interface and a support for the main superconducting magnet, the plurality of channels configured to extend axially towards the coil of the main superconducting magnet.

21. A superconducting magnet comprising:
a plurality of coils;
a support for supporting the plurality of coils; and
a thermal interface between the plurality of coils and the support, the thermal interface including a plurality of channels therein for receiving a cooling liquid to intercept a frictional heat generated between the thermal interface and the support, the plurality of channels extending axially between the plurality of coils and the support.

* * * * *